United States Patent
Shao et al.

(10) Patent No.: US 12,426,256 B2
(45) Date of Patent: Sep. 23, 2025

(54) SEMICONDUCTOR STRUCTURE INCLUDING A PLURALITY OF SEMICONDCUTOR PILLARS AND BIT LINE ISOLATION TRENCHES AND METHOD FOR FORMING SAME

(71) Applicants: CHANGXIN MEMORY TECHNOLOGIES, INC., Hefei (CN); BEIJING SUPERSTRING ACADEMY OF MEMORY TECHNOLOGY, BeiJing (CN)

(72) Inventors: Guangsu Shao, Hefei (CN); Deyuan Xiao, Hefei (CN); Yunsong Qiu, Hefei (CN); Minmin Wu, Hefei (CN)

(73) Assignees: CHANGXIN MEMORY TECHNOLOGIES, INC., Hefei (CN); BEIJING SUPERSTRING ACADEMY OF MEMORY TECHNOLOGY, Beijing (CN)

( * ) Notice: Subject to any disclaimer, the term of this patent is extended or adjusted under 35 U.S.C. 154(b) by 491 days.

(21) Appl. No.: 17/810,634

(22) Filed: Jul. 4, 2022

(65) Prior Publication Data

US 2023/0057480 A1 Feb. 23, 2023

Related U.S. Application Data

(63) Continuation of application No. PCT/CN2022/077727, filed on Feb. 24, 2022.

(30) Foreign Application Priority Data

Aug. 17, 2021 (CN) .......................... 202110941165.9

(51) Int. Cl.
*H01L 21/762* (2006.01)
*H01L 21/311* (2006.01)
(Continued)

(52) U.S. Cl.
CPC ...... *H10B 12/482* (2023.02); *H01L 21/31116* (2013.01); *H01L 21/76224* (2013.01);
(Continued)

(58) Field of Classification Search
CPC .. H10B 12/482; H10B 12/053; H10B 12/488; H10B 12/0335; H10B 12/315;
(Continued)

(56) References Cited

U.S. PATENT DOCUMENTS

| | | | | |
|---|---|---|---|---|
| 6,576,945 | B2 * | 6/2003 | Mandelman | H10B 12/0383 257/302 |
| 6,593,613 | B1 * | 7/2003 | Alsmeier | G11C 11/4074 257/296 |

(Continued)

FOREIGN PATENT DOCUMENTS

| | | |
|---|---|---|
| CN | 102054819 A | 5/2011 |
| CN | 103531479 A | 1/2014 |

(Continued)

*Primary Examiner* — Maliheh Malek
(74) *Attorney, Agent, or Firm* — SYNCODA LLC; Feng Ma

(57) ABSTRACT

A method for forming a semiconductor structure includes: providing a semiconductor substrate including a plurality of first semiconductor pillars and bit line isolation trenches arranged at intervals in a first direction; in which the bit line isolation trenches extend in a second direction, the first direction being perpendicular to the second direction; forming a bit line isolation layer in a bit line isolation trench; in which a gap is provided between the bit line isolation layer and the bit line isolation trench, in which the gap is located at a bottom corner of the bit line isolation trench and extends in the second direction, and exposes part of the bottom of the bit line isolation trench; etching a first semiconductor pillar in the first direction through the gap to form a bit line trench; forming a bit line in the bit line trench.

11 Claims, 33 Drawing Sheets

(51) Int. Cl.
*H10B 12/00* (2023.01)
*G11C 7/18* (2006.01)

(52) U.S. Cl.
CPC ............ *H10B 12/053* (2023.02); *H10B 12/30* (2023.02); *H10B 12/488* (2023.02); *G11C 7/18* (2013.01); *H10B 12/485* (2023.02)

(58) Field of Classification Search
CPC . H10B 12/485; H10B 12/30; H01L 21/31116; H01L 21/76224; H01L 23/5283; H01L 21/76895; H01L 21/28525; H01L 21/76897; H01L 21/764; H10D 62/115; G11C 7/18
See application file for complete search history.

(56) References Cited

U.S. PATENT DOCUMENTS

| | | | |
|---|---|---|---|
| 8,487,369 B2 | 7/2013 | Kim | |
| 8,987,811 B2 * | 3/2015 | Yu | H10B 12/053 |
| | | | 257/334 |
| 9,837,422 B2 * | 12/2017 | Kim | H10B 12/03 |
| 9,837,490 B2 * | 12/2017 | Park | H10B 12/485 |
| 11,404,538 B2 * | 8/2022 | Park | H10B 12/315 |
| 11,587,949 B1 * | 2/2023 | Guo | H10B 41/30 |
| 12,057,396 B2 * | 8/2024 | Hyung | H01L 21/76897 |
| 12,114,484 B2 * | 10/2024 | Feng | H10B 12/30 |
| 12,114,486 B2 * | 10/2024 | Wan | H10B 12/485 |
| 2011/0101450 A1 | 5/2011 | Kim | |
| 2013/0056812 A1 * | 3/2013 | Kim | H10B 61/22 |
| | | | 257/295 |
| 2016/0027727 A1 * | 1/2016 | Kim | H10B 12/34 |
| | | | 257/774 |
| 2017/0005166 A1 * | 1/2017 | Park | H10D 62/115 |
| 2018/0122898 A1 * | 5/2018 | Park | H01L 23/528 |
| 2018/0240705 A1 * | 8/2018 | Chang | H10B 12/485 |
| 2020/0035541 A1 * | 1/2020 | Chun | H10B 12/485 |
| 2020/0357803 A1 * | 11/2020 | Surthi | H01L 23/528 |
| 2021/0035613 A1 * | 2/2021 | Park | H10B 12/34 |
| 2021/0066304 A1 * | 3/2021 | Kang | H10B 12/05 |
| 2022/0165668 A1 * | 5/2022 | Hyung | H10B 12/482 |
| 2022/0172749 A1 * | 6/2022 | Ma | H10B 12/315 |
| 2022/0301931 A1 * | 9/2022 | Lu | H01L 21/76816 |
| 2023/0032102 A1 * | 2/2023 | Mei | H10B 12/34 |
| 2023/0123510 A1 * | 4/2023 | Yang | H01L 21/31144 |
| | | | 438/421 |
| 2023/0200054 A1 * | 6/2023 | Lee | H10B 12/0335 |
| | | | 257/295 |
| 2023/0209813 A1 * | 6/2023 | Lee | H01L 23/5226 |
| | | | 438/197 |
| 2024/0023308 A1 * | 1/2024 | Chu | H10B 12/485 |
| 2024/0038838 A1 * | 2/2024 | Liu | H01L 21/76224 |
| 2024/0071922 A1 * | 2/2024 | Lu | H10B 12/09 |
| 2024/0145386 A1 * | 5/2024 | Yoon | H01L 21/76897 |

FOREIGN PATENT DOCUMENTS

| | | |
|---|---|---|
| CN | 110880507 A | 3/2020 |
| CN | 113241346 A | 8/2021 |

* cited by examiner

SEMICONDUCTOR STRUCTURE INCLUDING A PLURALITY OF SEMICONDCUTOR PILLARS AND BIT LINE ISOLATION TRENCHES AND METHOD FOR FORMING SAME

CROSS-REFERENCE OF RELATED APPLICATIONS

This is a continuation application of International Patent Application No. PCT/CN2022/077727 filed on Feb. 24, 2022, which claims priority to Chinese Patent Application No. 202110941165.9 filed on Aug. 17, 2021. The disclosures of these applications are hereby incorporated by reference in their entirety.

BACKGROUND

A semiconductor device typically includes a plurality of transistors. For example, in a memory device such as dynamic random access memory (DRAM), a memory cell includes a metal-oxide-semiconductor field-effect transistor (MOSFET). Typically, in the MOSFET, a source/drain area is formed in the surface of a semiconductor substrate, and with such an arrangement, and a planar channel is formed between the source area and the drain area.

SUMMARY

The disclosure relates to the field of semiconductor technology, and relates to, but is not limited to, a semiconductor structure and a method for forming the same.

In a first aspect, the embodiments of the disclosure provide a method for forming a semiconductor structure including the following operations.

A semiconductor substrate is provided. The semiconductor substrate includes a plurality of first semiconductor pillars and bit line isolation trenches arranged at intervals in a first direction. The bit line isolation trenches extend in a second direction. The first direction is perpendicular to the second direction.

A bit line isolation layer is formed in a bit line isolation trench. A gap is provided between the bit line isolation layer and the bit line isolation trench. The gap is located at a bottom corner of the bit line isolation trench and extends in the second direction, and the gap exposes part of the bottom of the bit line isolation trench.

A first semiconductor pillar is etched in the first direction through the gap to form a bit line trench.

A bit line is formed in the bit line trench.

In a second aspect, the embodiments of the disclosure provide a semiconductor structure at least including: a semiconductor substrate, bit line isolation layers and bit lines.

The semiconductor substrate includes a plurality of first semiconductor pillars and bit line isolation trenches arranged at intervals in a first direction. The bit line isolation trenches extend in a second direction. The first direction is perpendicular to the second direction.

A bit line isolation layer is located in a bit line isolation trench.

Part of a bit line is buried at the bottom of a semiconductor pillar, and another part of the bit line is buried at a bottom corner between the bit line isolation layer and the bit line isolation trench

BRIEF DESCRIPTION OF THE DRAWINGS

In the accompanying drawings (which may not be drawn to scale), the similar reference numerals may describe similar components in different views. The similar reference numerals with different letter suffixes may denote different examples of similar components. The drawings generally illustrate, by way of example, and not limitation, various embodiments discussed herein.

REFERENCE NUMERALS

Figure 1:
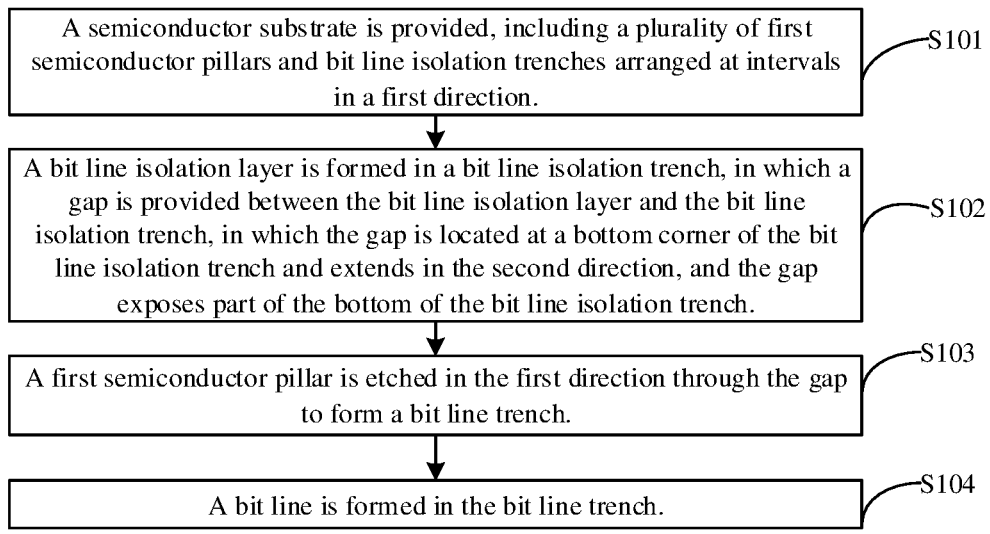
FIG. 1 is an optional flow chart of a method for forming a semiconductor structure provided by an embodiment of the disclosure.

20: semiconductor substrate; 201: bit line isolation trench; 201-1: first sidewall of the bit line isolation trench; 201-2: second sidewall of the bit line isolation trench; 202: first semiconductor pillar; 203a: first initial isolation layer; 203: remaining first initial isolation layer; 204a: second initial isolation layer; 204: remaining second initial isolation layer; 205: third initial isolation layer; 206a: initial bit line isolation layer; 206/404: bit line isolation layer; 207a: initial bit line layer; 207/402: bit line; 208: insulating layer; 301/405: second semiconductor pillar; 302: word line trench; 303/406: gate insulating layer; 304a: bottom initial barrier layer; 304/409: bottom barrier layer; 305a: initial word line layer; 305/403: word line; 306a: top initial barrier layer; 306/408: top barrier layer; 307a: word line isolation trench; 307/407-word line isolation layer; 40: semiconductor structure; 401: semiconductor pillar; 410: channel; A: first etching groove; B: opening; C: gap; D: second etching groove; D': third etching groove; E/E': bit line trench; F: fourth etching groove.

DETAILED DESCRIPTION

Exemplary implementation modes of the present disclosure will be described in more detail below with reference to the accompanying drawings. Although exemplary implementation modes of the present disclosure are shown in the drawings, it should be understood that the present disclosure may be implemented in various forms and should not be limited to the specific implementation modes set forth herein. Rather, these implementation modes are provided for the purpose that the disclosure will be more thoroughly understood and the scope of the disclosure will be fully conveyed to those skilled in the art.

In the description below, numerous specific details are given for providing a thorough understanding of the disclosure. However it will be apparent to those skilled in the art that the disclosure may be implemented without one or more of these details. In other examples, some technical features well-known in the art are not described in order to avoid confusion with the present disclosure. That is, not all of the features of actual embodiments are described herein, and well-known functions and structures are not described in detail.

In the drawings, the dimensions of layers, regions, elements and their relative dimensions may be exaggerated for clarity. The same reference numeral denotes the same element throughout the text.

It should be understood that, when an element or a layer is referred to as being "on", "adjacent to", "connected to" or "coupled to" another element or layer, it may be directly on, adjacent to, or connected to or coupled to another element or layer, or there may be an intermediate element or layer therebetween. In contrast, when an element is referred to as being "directly on", "directly adjacent to", "directly connected to" or "directly coupled to" another element or layer, there is no intermediate element or layer. It should be understood that, although the terms "first", "second", "third" and the like may be used to describe various elements, components, regions, layers, and/or portions, these elements, components, regions, layers, and/or portions should not be limited by these terms. These terms are only used to distinguish one element, component, region, layer or portion from another element, component, region, layer or portion. Therefore, without departing from the teaching of the present disclosure, a first element, component, region, layer or portion discussed hereinafter may be expressed as a second element, component, region, layer or portion. While discussing a second element, component, region, layer or portion, it does not imply that a first element, component, region, layer or portion is necessarily present in the present disclosure.

The terms used herein are intended to describe specific embodiments only and are not to be a limitation to the present disclosure. As used herein, the singular forms "a", "an", and "the/said" are intended to include the plural forms as well, unless the context clearly dictates otherwise. It should be further understood that, when terms "consist of" and/or "include" as used in the specification determine that the stated features, integers, steps, operations, elements and/or components are present, but the presence or addition of one or more other features, integers, steps, operations, elements, components and/or groups is not excluded. As used herein, the term "and/or" includes any of the listed items and all combinations thereof.

With the increasing integration of a memory device, MOSFET manufacturing will reach a physical limit, and with the shrinking of the size of MOSFET, the data maintenance performance of the memory device is getting worse. In this case, a vertical channel transistor (VCT) emerges as the times require. In the VCT, a source area and a drain area are formed at the corresponding ends of a pillar. Any one of the source area and the drain area can be connected with a bit line. The bit line is formed by being buried in a trench defined between the semiconductor pillars, and is thus called a buried bit line (BBL).

In some implementations, the bit lines are all buried at the bottom of the channel. On the one hand, the bit line resistance, the bit line voltage and the bit line current are relatively large. On the other hand, since the bit lines are in contact with the semiconductor pillars, a large parasitic capacitance is generated between adjacent bit lines.

Based on the problems existing in some implementations, the embodiments of the present disclosure provide a semiconductor structure and a method for forming the same. The method for forming a semiconductor structure includes: providing a semiconductor substrate which includes a plurality of first semiconductor pillars and bit line isolation trenches arranged at intervals in a first direction, in which the bit line isolation trenches extend in a second direction; forming a bit line isolation layer in a bit line isolation trench, in which a gap is provided between the bit line isolation layer and the bit line isolation trench, the gap being located at a bottom corner of the bit line isolation trench and extending in the second direction; etching a first semiconductor pillar in the first direction through the gap to form a bit line trench; forming a bit line in the bit line trench. In the semiconductor structure formed by the method for forming a semiconductor structure provided by the embodiments of the present disclosure, part of a bit line is buried in the bit line isolation trench, and another part of the bit line is buried in the bottom of the first semiconductor pillar, so that the bit line resistance, voltage and current of the formed semiconductor structure can be reduced, and the parasitic capacitance between two adjacent bit lines can be reduced, thereby improving the performance of the semiconductor structure.

The embodiments of the disclosure provide a method for forming a semiconductor structure, as shown in FIG. 1, the method for forming a semiconductor structure includes the following operations.

In S101, a semiconductor substrate is provided, which includes a plurality of first semiconductor pillars and bit line isolation trenches arranged at intervals in a first direction.

The bit line isolation trenches extend in a second direction, and the first direction is perpendicular to the second direction.

The semiconductor substrate may be a silicon substrate. The semiconductor substrate may also include other semiconductor elements such as germanium (Ge), or semiconductor compounds such as silicon carbide (SiC), gallium arsenide (GaAs), gallium phosphide (GaP), indium phosphide (InP), indium arsenide (InAs) or indium antimonide (InSb), or other semiconductor alloys such as silicon germanium (SiGe), arsenic gallium phosphide (GaAsP), indium aluminum arsenide (AlInAs), gallium aluminum arsenide (AlGaAs), indium gallium arsenide (GaInAs), indium gallium phosphide (GaInP), and/or indium gallium arsenophosphate (GaInAsP) or combinations thereof.

The semiconductor substrate may include a top surface at a front and a bottom surface at a back opposite to the front. A direction perpendicular to the top and bottom surfaces of the semiconductor substrate is defined as a third direction in the case of ignoring the flatness of the top and bottom surfaces. In the direction of the top surface and the bottom surface (that is, the plane where the semiconductor substrate is located) of the semiconductor substrate, a first direction and a second direction intersecting each other (e.g. perpendicular to each other) are defined. For example, the arrangement direction of a plurality of bit line isolation trenches may be defined as a first direction, and the extension direction of the bit line isolation trenches is defined as a second direction. The planar direction of the semiconductor substrate may be determined based on the first direction and the second direction. Herein, the first direction, the second direction and the third direction are pairwise perpendicular. In the embodiments of the present disclosure, the first direction is defined as an X-axis direction, the second direction is defined as a Y-axis direction, and the third direction is defined as a Z-axis direction.

In an embodiment of the disclosure, the bit line isolation trenches are used to be filled with isolation materials to isolate the bit lines finally formed. The first semiconductor pillar is the semiconductor substrate located between two adjacent bit line isolation trenches after the semiconductor substrate is etched to form a plurality of bit line isolation trenches. The bit line isolation trenches and the first semiconductor pillars are arranged at intervals in the first direction.

In S102, bit line isolation layers are formed in the bit line isolation trenches, in which a gap is provided between a bit line isolation layer and a bit line isolation trench. The gap is located at a bottom corner of the bit line isolation trench and extend in the second direction, and the gap exposes part of the bottom of the bit line isolation trench.

In S103, the first semiconductor pillars are etched in the first direction through the gaps to form bit line trenches.

Here, etching the first semiconductor pillars in the first direction through the gaps may be etching part of the first semiconductor pillar in the first direction or etching all of the first semiconductor pillar in the first direction.

In S104, bit lines are formed in the bit line trenches.

FIG. 2A to FIG. 2T and FIG. 3A to FIG. 3H are schematic structural diagrams of a forming process of a semiconductor structure provided by the embodiments of the disclosure. Next, the method for forming a semiconductor structure provided by the embodiments of the disclosure will be further described in detail with reference to FIG. 2A to FIG. 2T and FIG. 3A to FIG. 3H.

Firstly, referring to FIG. 2A to FIG. 2E, S101 is performed, where a semiconductor substrate is provided, which includes a plurality of first semiconductor pillars and bit line isolation trenches arranged at intervals in a first direction.

In some embodiments, S101 may include the following operations.

In S1011, a semiconductor substrate is provided.

In S1012, a patterned photoresist layer is formed on the surface of the semiconductor substrate.

In S1013, the semiconductor substrate is etched with the patterned photoresist layer to form a plurality of first semiconductor pillars and bit line isolation trenches arranged at intervals in a first direction.

Figure 2A:
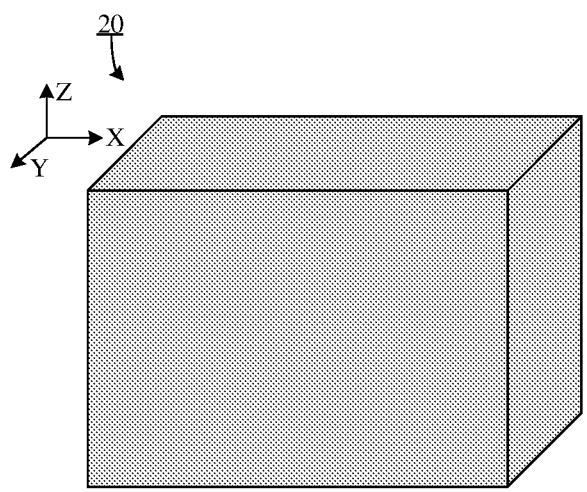
FIG. 2A is a first schematic structural diagram of a forming process of a semiconductor structure provided by the embodiments of the disclosure.
Figure 2B:
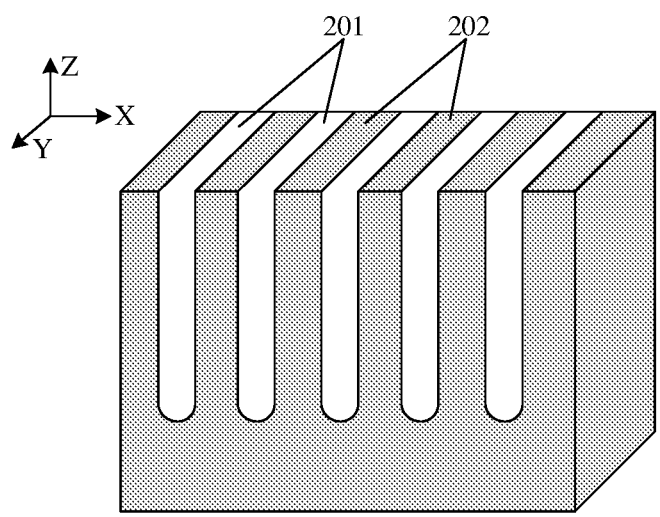
FIG. 2B is a second schematic structural diagram of a forming process of a semiconductor structure provided by the embodiments of the disclosure.
Figure 2C:
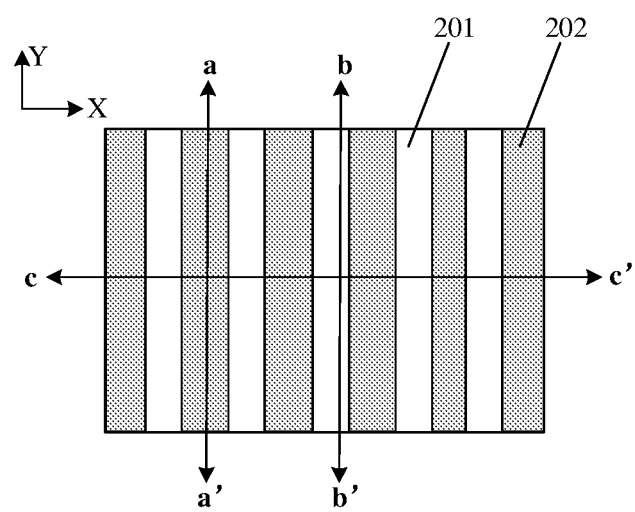
FIG. 2C is a third schematic structural diagram of a forming process of a semiconductor structure provided by the embodiments of the disclosure.
Figure 2D:
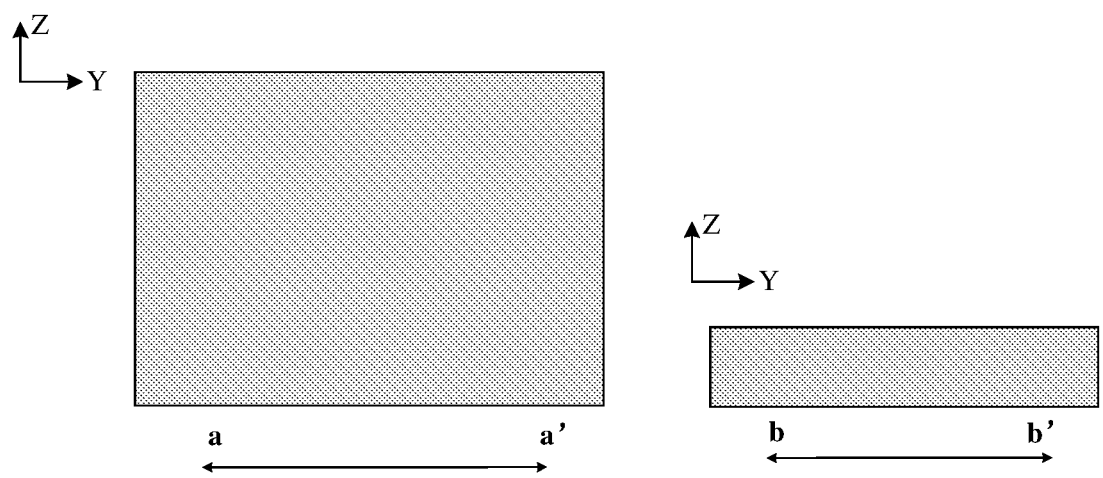
FIG. 2D is a fourth schematic structural diagram of a forming process of a semiconductor structure provided by the embodiments of the disclosure.
Figure 2E:
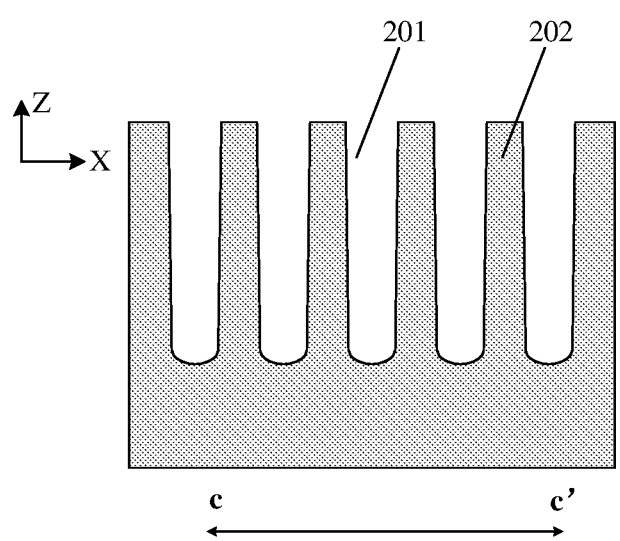
FIG. 2E is a fifth schematic structural diagram of a forming process of a semiconductor structure provided by the embodiments of the disclosure.

As shown in FIG. 2A and FIG. 2B, the semiconductor substrate 20 is etched in the Z-axis direction to form the bit line isolation trenches 201 and the first semiconductor pillars 202 arranged at intervals in the X-axis direction. The bit line isolation trenches 201 extend in the Y-axis direction. FIG. 2C is a top view of the semiconductor pillars after etching, and FIG. 2D and FIG. 2E are sectional diagrams in the directions a-a', b-b' and c-c' in FIG. 2C, respectively. It can be seen that a semiconductor substrate with a partial thickness still remains at the bottoms of the bit line isolation trenches 201.

Next, referring to FIG. 2F to FIG. 2J, S102 is performed, where bit line isolation layers are formed in the bit line isolation trenches, in which a gap is provided between the bit line isolation layer and the bit line isolation trench. The gap is located at a bottom corner of the bit line isolation trench and extends along the second direction, and the gap exposes part of the bottom of the bit line isolation trench.

In some embodiments, S102 may be implemented by the following operation.

In S1021, initial bit line isolation layers are formed in the bit line isolation trenches.

In some embodiments, the initial bit line isolation layers may be formed by the following operation.

In S10, a first initial isolation layer and a second initial isolation layer are formed in sequence in the bit line isolation trench.

The materials of the first initial isolation layer and the second initial isolation layer may independently be any suitable insulating material, but the material of the first initial isolation layer is different from that of the second initial isolation layer. For example, the first initial isolation layer may be a silicon oxide layer, and the second initial isolation layer may be a silicon nitride layer.

In embodiments of the disclosure, the first initial isolation layer and the second initial isolation layer may be formed by any one of suitable deposition processes, such as chemical vapor deposition (CVD), physical vapor deposition (PVD), atomic layer deposition (ALD), spin coating, or coating.

It is to be noted that, during forming the second initial isolation layer, due to the influence of process, the second initial isolation layer tends to cover the top surface of the first semiconductor pillar. In this case, a dry etching process or a chemical mechanical polishing (CMP) process is required for the second initial isolation layer to expose the top surface of the first semiconductor pillar. Accordingly, the top surface of the second initial isolation layer is flush with the top surface of the first semiconductor pillar in the embodiments of the disclosure.

Figure 2F:
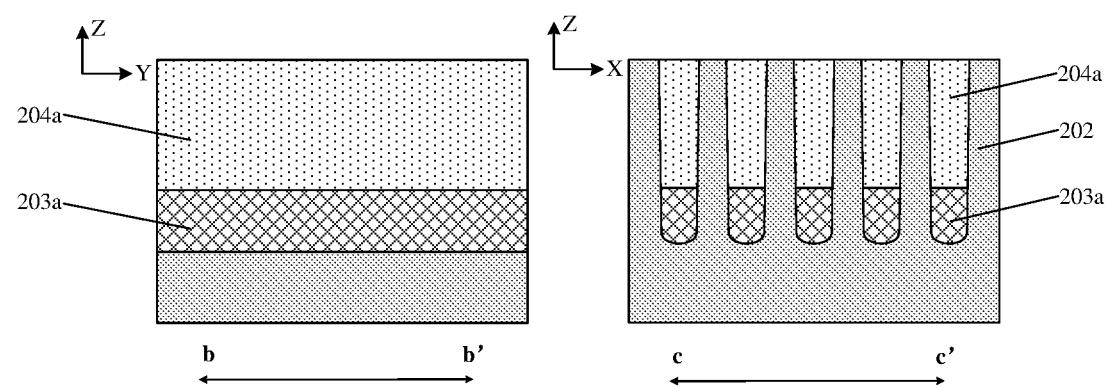
FIG. 2F is a sixth schematic structural diagram of a forming process of a semiconductor structure provided by the embodiments of the disclosure.

As shown in FIG. 2F, the first initial isolation layer 203a and the second initial isolation layer 204a are sequentially formed in the bit line isolation trench. The top surface of the second initial isolation layer 204a is flush with the top surface of the first semiconductor pillar 202.

In S11, part of the second initial isolation layer and part of the first initial isolation layer are removed by etching in sequence in a third direction to form a first etching groove. The first etching groove expose a first sidewall of the bit line isolation trench and part of the bottom of the bit line isolation trench. The third direction is a depth direction of the bit line isolation channels.

In the embodiments of the disclosure, the part of the second initial isolation layer and the part of the first initial isolation layer may be removed by dry etching, such as plasma etching, reactive ion etching, or ion beam milling.

Figure 2G:
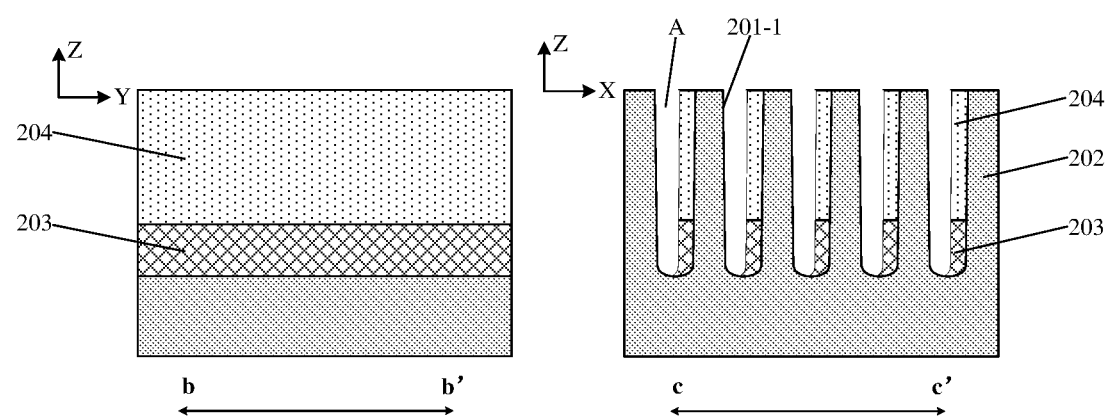
FIG. 2G is a seventh schematic structural diagram of a forming process of a semiconductor structure provided by the embodiments of the disclosure.

As shown in FIG. 2G, the second initial isolation layer 204a and the first initial isolation layer 203a are sequentially etched in the Z-axis direction to remove part of the second initial isolation layer 204a and part of the first initial isolation layer 203a, and expose the first sidewall 201-1 of the bit line isolation trench and part of the bottom of the bit line isolation trench, so as to form the first etching groove A. After the first etching groove A is formed, the remaining first initial isolation layer 203 and the remaining second initial isolation layer 204 are retained in the bit line isolation trench.

In the embodiments of the disclosure, removing part of the second initial isolation layer 204a and part of the first initial isolation layer 203a may be removing half of the second initial isolation layer 204a in each bit line isolation trench and removing half of the first initial isolation layer 203a in each bit line isolation trench. In other embodiments, other proportions of the second initial isolation layer and the first initial isolation layer may be removed. For example, ⅗ of the second initial isolation layer and the first initial isolation layer are removed.

In S12, an isolation material is filled in the first etching groove to form a third initial isolation layer.

In some embodiments, the isolation material may be any one of insulating materials, such as silicon oxide, silicon nitride, silicon oxynitride or the like. In the embodiments of the disclosure, the isolation material is the same as the material of the second initial isolation layer.

It is to be noted that, during forming the third initial isolation layer, due to the influence of process, the third initial isolation layer tends to cover the top surfaces of the first semiconductor pillar and the second initial isolation layer. In this case, a dry etching process or a CMP process is required for the third initial isolation layer to expose the top surfaces of the first semiconductor pillar and the second initial isolation layer. Accordingly, the top surface of the third initial isolation layer is flush with the top surfaces of the first semiconductor pillar and the remaining second initial isolation layer in the embodiments of the disclosure.

Figure 2H:
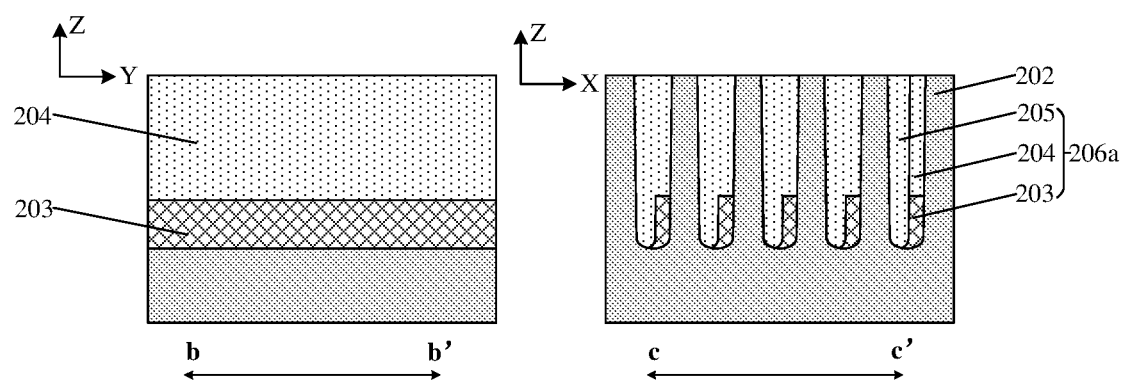
FIG. 2H is an eighth schematic structural diagram of a forming process of a semiconductor structure provided by the embodiments of the disclosure.

As shown in FIG. 2H, the first etching groove A is filled with an isolation material to form the third initial isolation layer 205. The top surface of the third initial isolation layer 205 is flush with the top surfaces of the first semiconductor pillar 202 and the remaining second initial isolation layer 204. The remaining first initial isolation layer 203, the remaining second initial isolation layer 204 and the third initial isolation layer 205 constitute the initial bit line isolation layer 206a.

In S1022, part of the initial bit line isolation layer is removed to form the bit line isolation layer and the gap.

In some embodiments, the bit line isolation layer and the gap may be formed by the following operations.

In S13, the remaining second initial isolation layer and the remaining first initial isolation layer are etched in sequence in the third direction at an end of the bit line isolation trench to form at least one opening.

Here, the opening may be formed by dry etching.

Figure 2I:
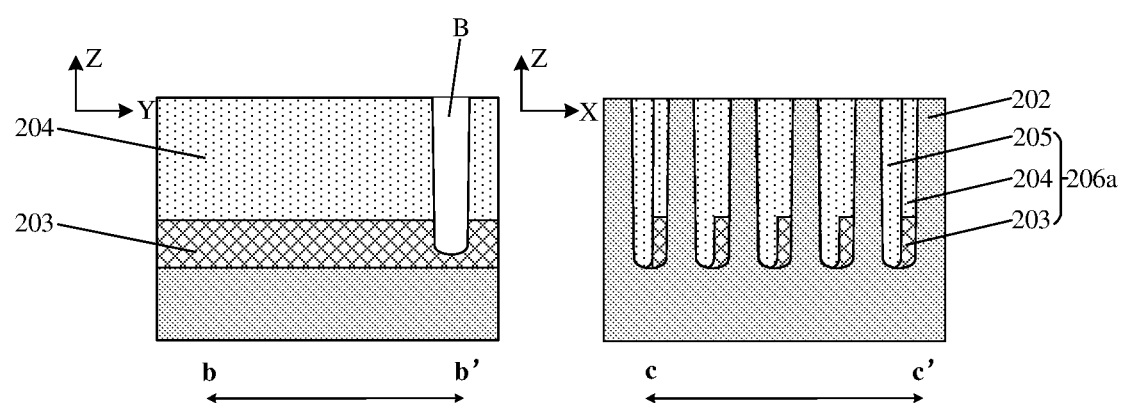
FIG. 2I is a ninth schematic structural diagram of a forming process of a semiconductor structure provided by the embodiments of the disclosure.

As shown in FIG. 2I, the remaining the second initial isolation layer 204 and the remaining first initial isolation layer 203 are sequentially etched in the Z-axis direction at either end or both ends of the bit line isolation trench to form one or two openings B. The bottom of the openings B is located inside the further remaining first initial isolation layer 203.

In S14, the further remaining first initial isolation layer of the initial bit line isolation layer is removed through the opening to form the bit line isolation layer and the gap.

Figure 2J:
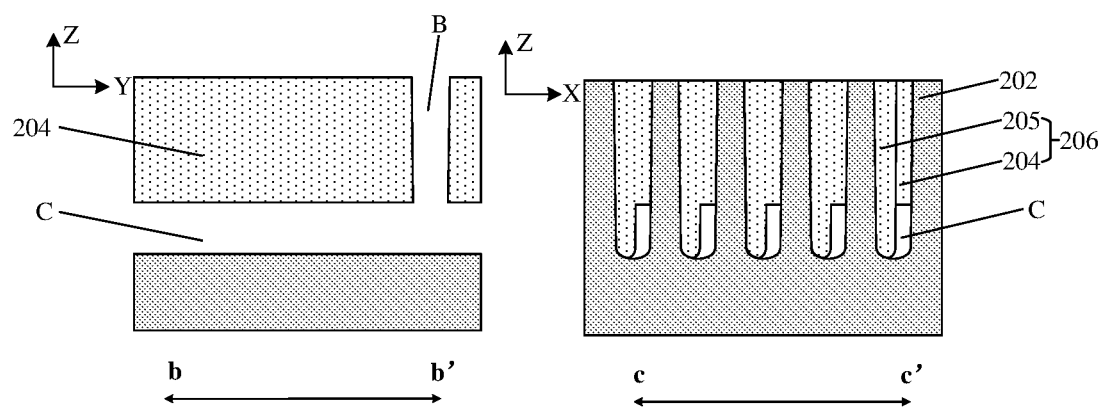
FIG. 2J is a tenth schematic structural diagram of a forming process of a semiconductor structure provided by the embodiments of the disclosure.

As shown in FIG. 2J, a wet etching is used. An etchant, such as a phosphoric acid solution ($H_3PO_4$), a sulfuric acid solution or a hydrofluoric acid solution, is injected via the opening B to remove the further remaining first initial isolation layer 203 of the initial bit line isolation layer 206a, so as to form the bit line isolation layer 206 and the gap. The gap C extends in the Y-axis direction.

Figure 2K:
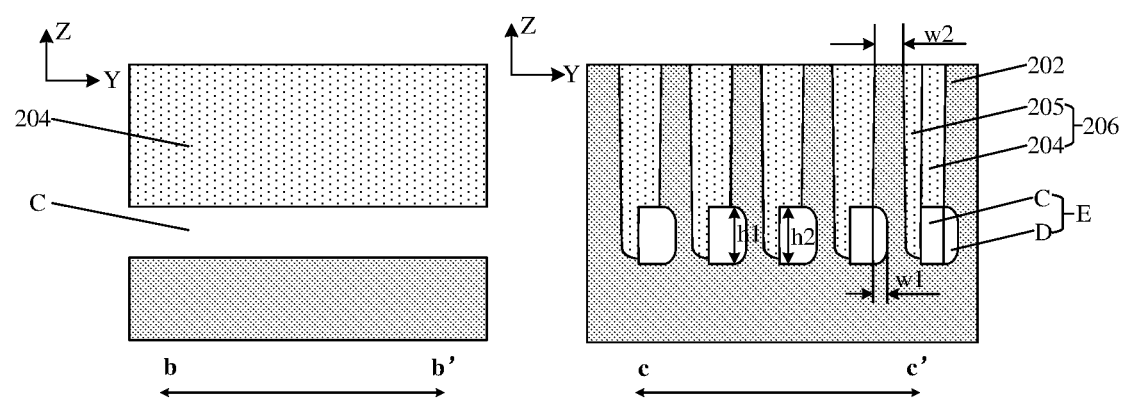
FIG. 2K is an eleventh schematic structural diagram of a forming process of a semiconductor structure provided by the embodiments of the disclosure.
Figure 2L:
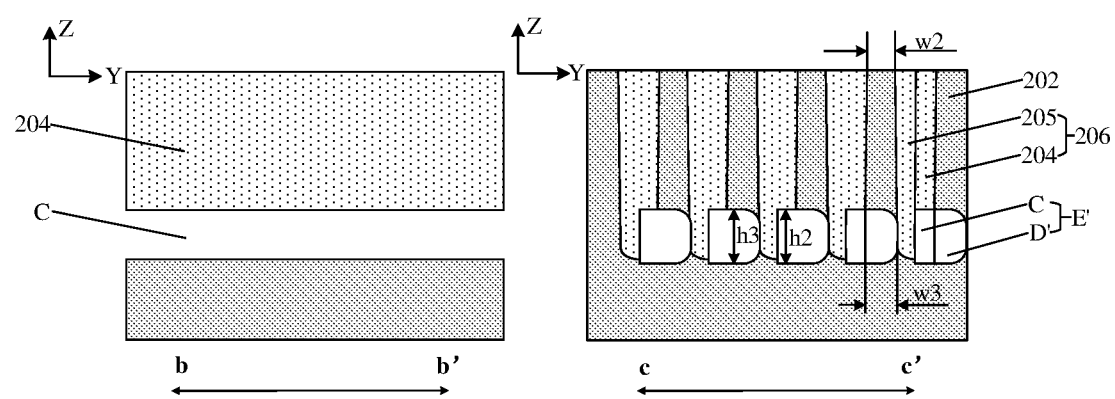
FIG. 2L is a twelfth schematic structural diagram of a forming process of a semiconductor structure provided by the embodiments of the disclosure.

Next, referring to FIG. 2K and FIG. 2L, S103 is performed, where the first semiconductor pillars are etched in the first direction through the gaps to form bit line trenches.

In the embodiments of the present disclosure, the process of etching the first semiconductor pillars through the gaps is a wet etching process, and the process of etching the first semiconductor pillars may include the following two etching processes.

The first etching process is to partially etch the first semiconductor pillar in the first direction through a gap to form a second etching groove. The dimension of the second etching groove in the third direction is equal to the dimension of the gap in the third direction, and the dimension of the second etching groove in the first direction is smaller than the dimension of the first semiconductor pillar in the first direction. The second etching groove and the gap jointly constitute the bit line trench.

As shown in FIG. 2K, the first semiconductor pillar 202 is partially etched in the X-axis direction through the gap C to form the second etching groove D. The dimension h1 of the second etching groove D in the Z-axis direction is equal to the dimension h2 of the gap C in the Z-axis direction, and the dimension w1 of the second etching groove D in the Y-axis direction is smaller than the dimension w2 of the gap C in the Y-axis direction. In the embodiments of the disclosure, the second etching groove D and the gap C jointly constitute the bit line trench E.

The second etching process is to etch the entire first semiconductor pillar in the first direction through the gap to form the third etching groove. The dimension of the third etching groove in the third direction is equal to the dimension of the gap in the third direction, and the dimension of the third etching groove in the first direction is equal to the dimension of the first semiconductor pillar in the first direction. The third etching groove and the gap jointly constitute the bit line trench.

As shown in FIG. 2L, the first semiconductor pillar 202 is completely etched in the X-axis direction through the gap C to form the third etching groove D'. The dimension h3 of the third etching groove D' in the Z-axis direction is equal to the dimension h2 of the gap C in the Z-axis direction, and the dimension w3 of the second etching groove D' in the Y-axis direction is equal to the dimension w2 of the gap C in the Y-axis direction. In the embodiments of the disclosure, the third etching groove D' and the gap C jointly constitute the bit line trench E'.

Next, referring to FIGS. 2M to 2T, S104 is preformed, where bit lines are formed in the bit line trenches.

In some embodiments, before the bit lines are formed, the method further includes the following operation.

In S15, the further remaining second initial isolation layer is removed by etching in the third direction to form a fourth etching groove. The fourth etching groove exposes the gap and a second sidewall of the bit line isolation trench.

In the embodiments of the disclosure, the further remaining second initial isolation layer may be removed by dry etching to form the fourth etching groove.

Figure 2M:
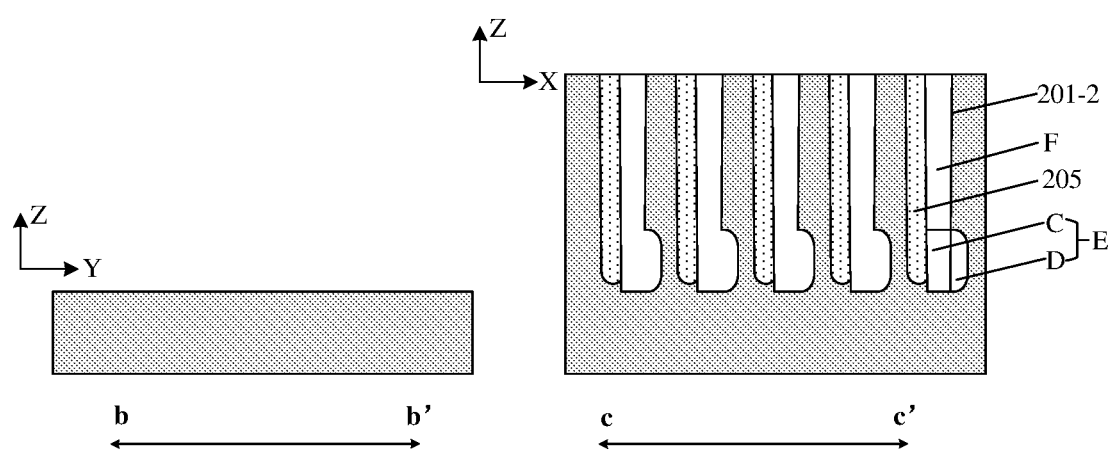
FIG. 2M is a thirteenth schematic structural diagram of a forming process of a semiconductor structure provided by the embodiments of the disclosure.
Figure 2N:
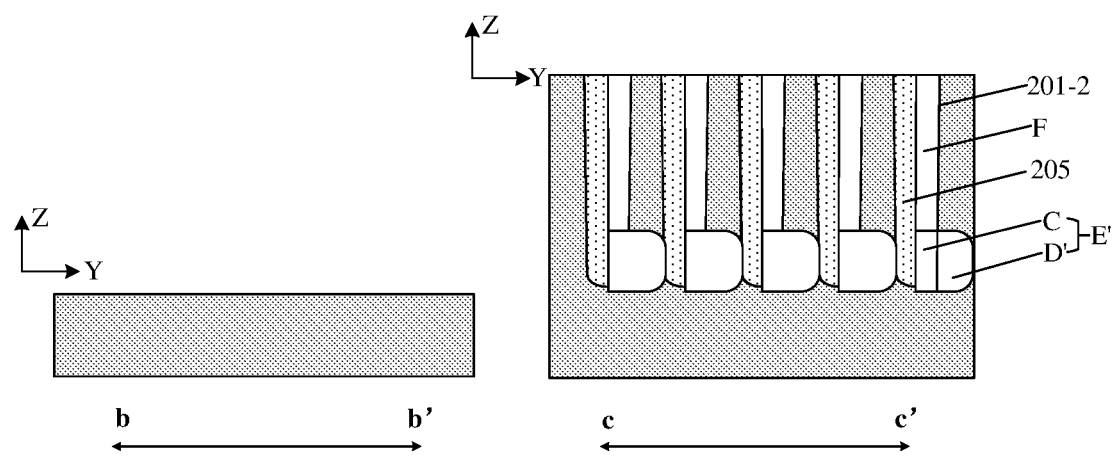
FIG. 2N is a fourteenth schematic structural diagram of a forming process of a semiconductor structure provided by the embodiments of the disclosure.

As shown in FIG. 2M and FIG. 2N, the further remaining second initial isolation layer 204 is removed by etching in the Z-axis direction to form the fourth etching groove F. The fourth etch groove F exposes the gap C and the second sidewall 201-2 of the bit line isolation trench.

In S16, the bit lines are formed in the bit line trenches through the fourth etching grooves.

In some embodiments, S16 may be implemented by the following operations.

In S161, an initial bit line layer is formed in the fourth etching groove and the bit line trench.

Figure 2O:
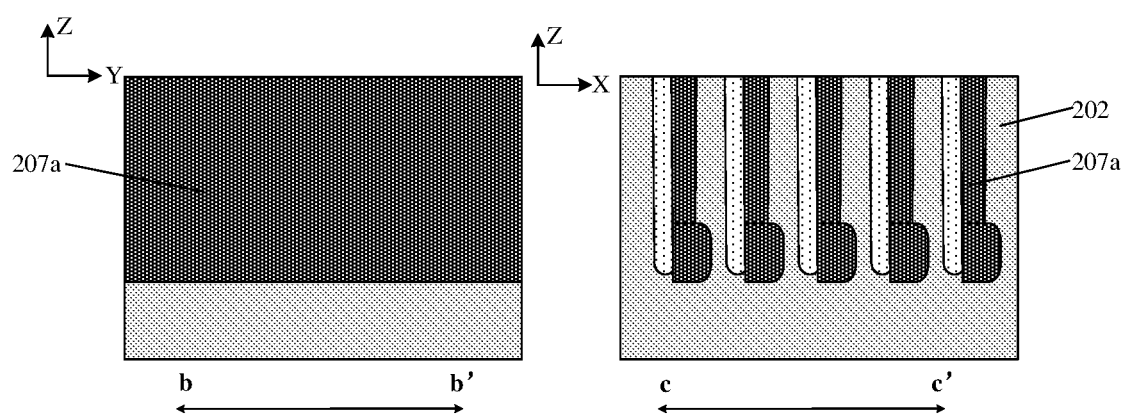
FIG. 2O is a fifteenth schematic structural diagram of a forming process of a semiconductor structure provided by the embodiments of the disclosure.
Figure 2P:
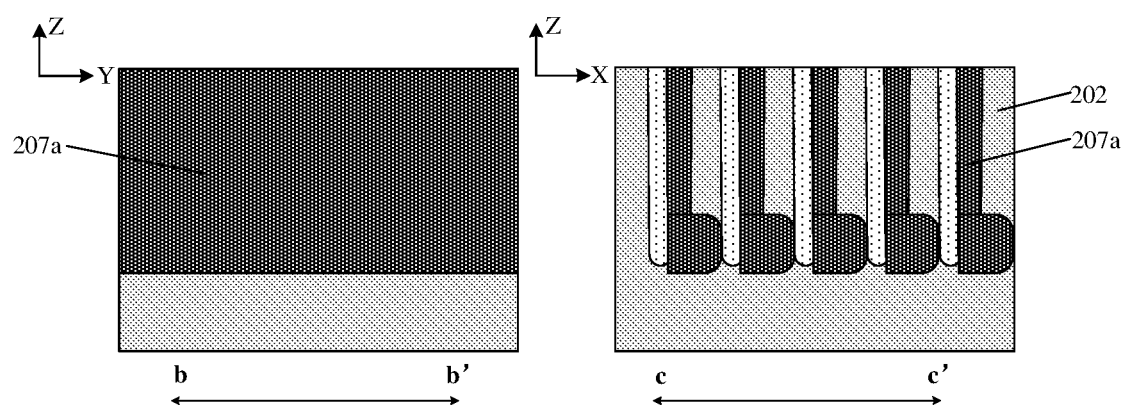
FIG. 2P is a sixteenth schematic structural diagram of a forming process of a semiconductor structure provided by the embodiments of the disclosure.

As shown in FIG. 2O and FIG. 2P, an initial bit line layer 207a is formed in the fourth etch groove F and the bit line trench E or the bit line trench E' by any suitable deposition process.

In S162, the initial bit line layer is etched back to remove the initial bit line layer located in the fourth etching groove to form the bit line.

Figure 2Q:
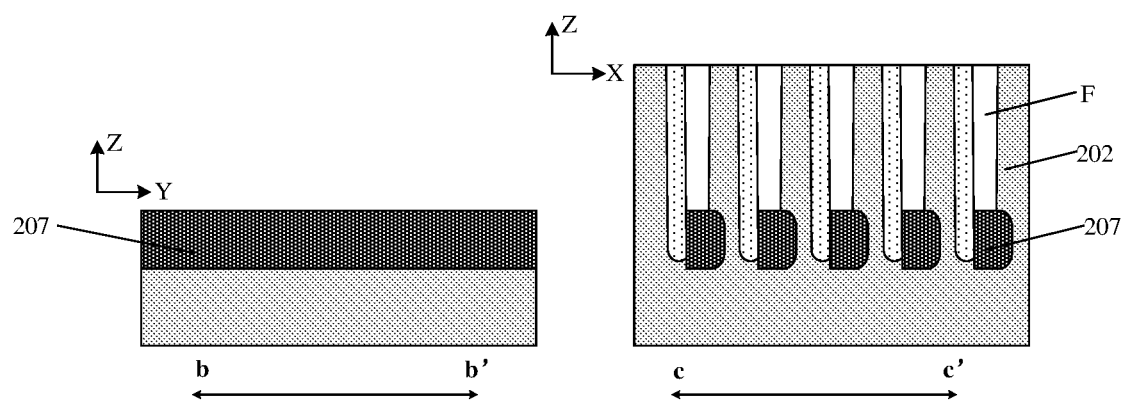
FIG. 2Q is a seventeenth schematic structural diagram of a forming process of a semiconductor structure provided by the embodiments of the disclosure.
Figure 2R:
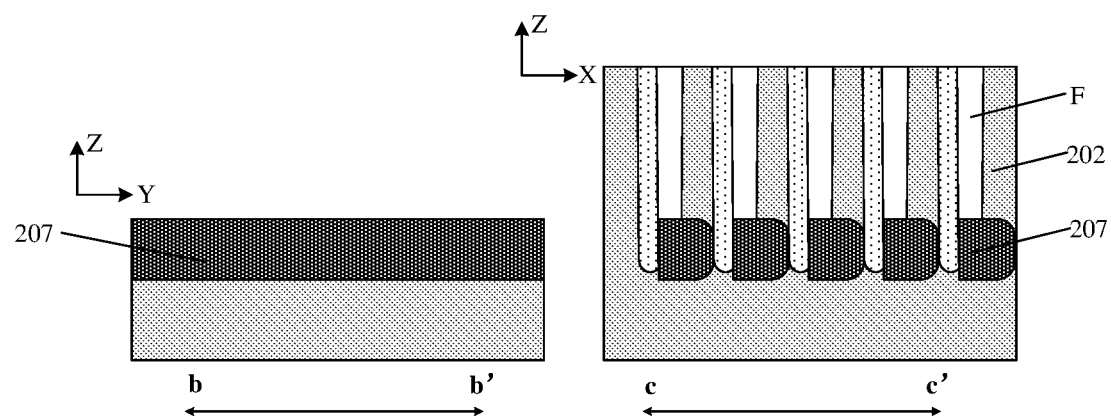
FIG. 2R is an eighteenth schematic structural diagram of a forming process of a semiconductor structure provided by the embodiments of the disclosure.

As shown in FIG. 2Q and FIG. 2R, the initial bit line layer 207a is etched back to remove the initial bit line layer located in the fourth etching groove F to form the bit line 207.

In the embodiments of the disclosure, the material of the initial bit line layer or bit line include tungsten (W), cobalt (Co), copper (Cu), aluminum (Al), polysilicon, doped silicon, silicide, or any combination thereof.

In some embodiments, after the bit lines are formed, the method for forming a semiconductor structure further includes the following operations.

In S17, an insulating material is filled in the fourth etching groove to form an insulating layer.

Here, an insulating material for forming the insulating layer and the material of the third initial isolation layer may be the same or different.

Figure 2S:
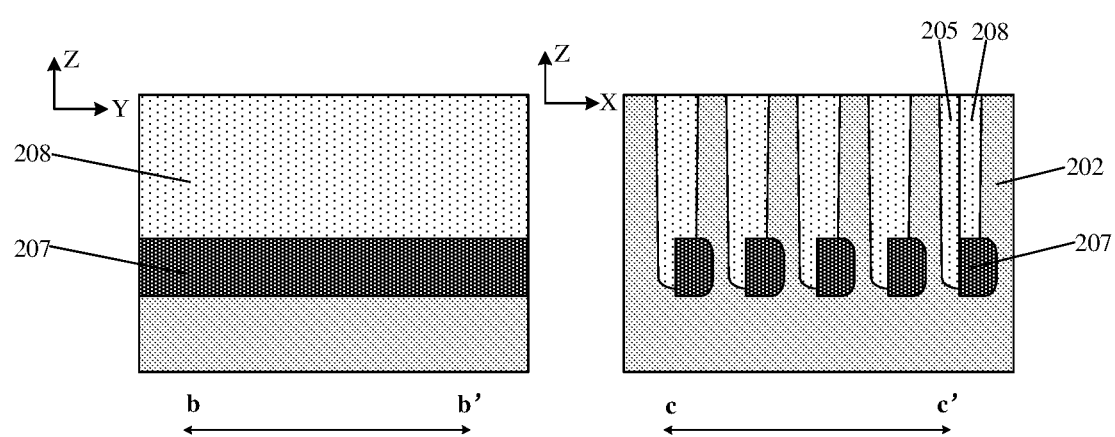
FIG. 2S is a nineteenth schematic structural diagram of a forming process of a semiconductor structure provided by the embodiments of the disclosure.
Figure 2T:
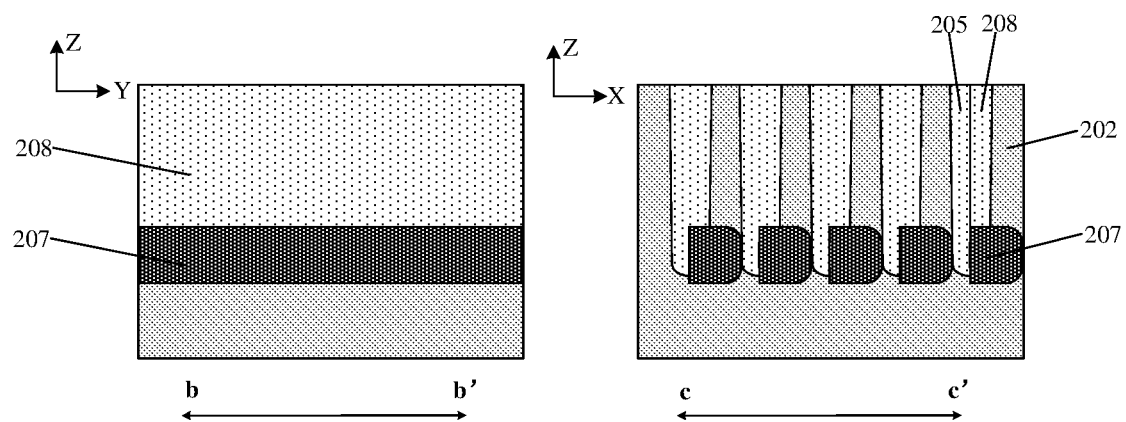
FIG. 2T is a twentieth schematic structural diagram of a forming process of a semiconductor structure provided by the embodiments of the disclosure.

As shown in FIGS. 2S and 2T, the fourth etching groove F is filled with an insulating material to form the insulating layer 208. The top surface of the insulating layer 208 is flush with the top surface of the third initial isolation layer 205.

In some embodiments, after the insulating layer is formed, the method for forming a semiconductor structure further includes the following operations. Next, it is taken as an example that the first semiconductor pillar are partially etched in the first direction (i.e., the bit line groove E), the subsequent forming process will be explained with reference to FIG. 3A to FIG. 3H.

In S18, a plurality of word line trenches are formed in the first semiconductor pillars. The word line trenches extend in the first direction.

In the embodiments of the disclosure, the word line trenches are used for forming the word lines and the word line isolation structures.

In some embodiments, S18 may be implemented by the following operation.

In S181, the first semiconductor pillars are etched in the third direction to form a plurality of word line trenches and second semiconductor pillars arranged at intervals in the second direction.

Figure 3A:
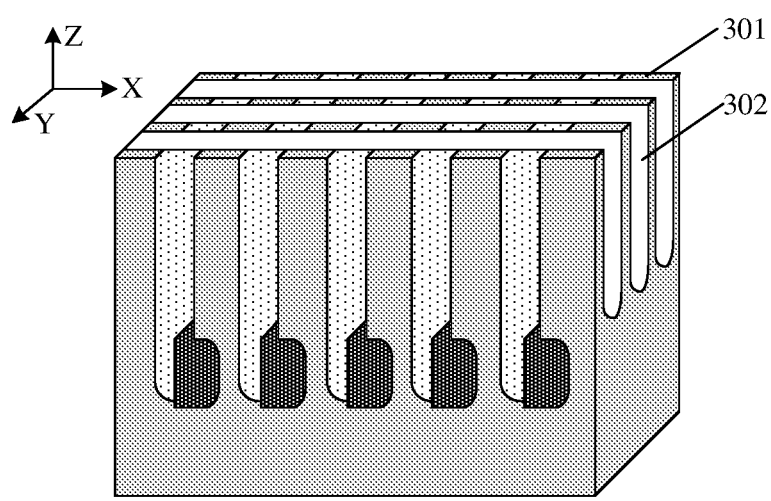
FIG. 3A is a twenty-first schematic structural diagram of a forming process of a semiconductor structure provided by the embodiments of the disclosure.
Figure 3B:
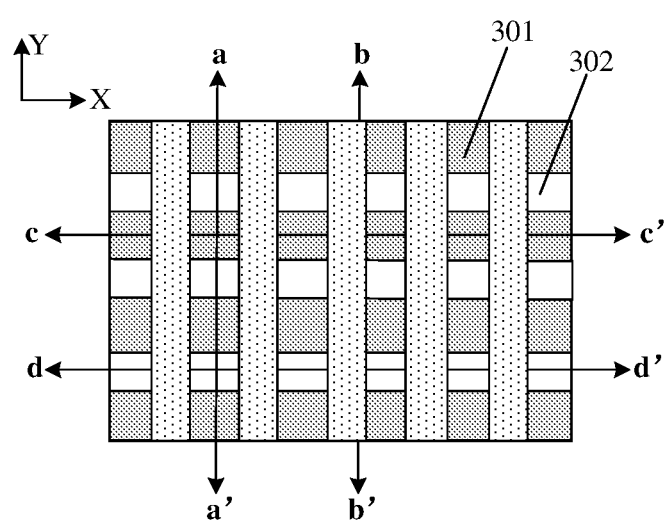
FIG. 3B is a twenty-second schematic structural diagram of a forming process of a semiconductor structure provided by the embodiments of the disclosure.
Figure 3C:
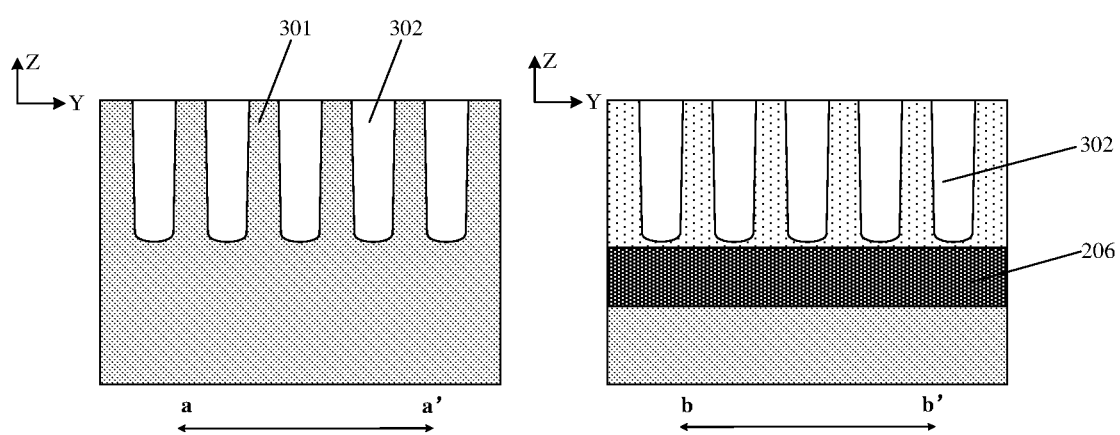
FIG. 3C is a twenty-third schematic structural diagram of a forming process of a semiconductor structure provided by the embodiments of the disclosure.
Figure 3D:
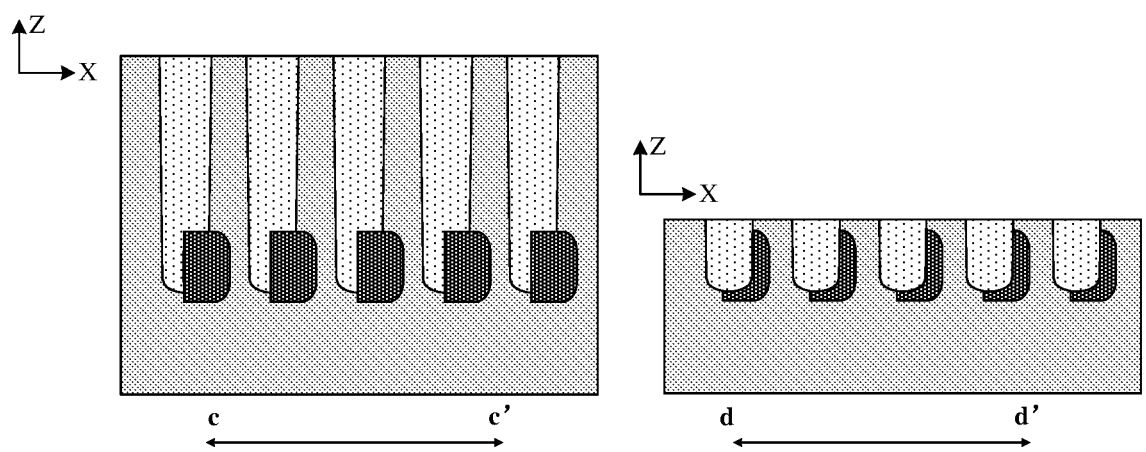
FIG. 3D is a twenty-fourth schematic structural diagram of a forming process of a semiconductor structure provided by the embodiments of the disclosure.

As shown in FIG. 3A, the first semiconductor pillars are etched in the Z-axis direction to form a plurality of second semiconductor pillars 301 and word line trenches 302 arranged at intervals in the Y-axis direction. The word line trenches extend in the X-axis direction. FIG. 3B is a top view of the etched semiconductor pillars. FIG. 3C and FIG. 3D are sectional diagrams in the directions a-a', b-b', c-c' and d-d' in FIG. 3B, respectively. It can be seen that the bottom of the word line trenches 302 is above the top of the bit lines 206.

In S19, word lines are formed in the word line trenches.

In some embodiments, the process for forming the word lines may include the following operations.

In S191, a gate insulating layer is formed on sidewalls of the word line trench.

In S192, a bottom initial barrier layer, an initial word line layer and a top initial barrier layer are formed in sequence in the word line trench with the gate insulating layer formed.

The material of the gate insulating layer may be any insulating material, such as silicon oxide. The materials of the bottom initial barrier layer and the top initial barrier layer may be the same or different. For example, both the bottom initial barrier layer and the top initial barrier layer may be formed from silicon nitride. The material of the initial word line layer include tungsten, cobalt, copper, aluminum, polysilicon, doped silicon, silicide, or any combination thereof.

In the embodiments of the disclosure, the gate insulating layer, the bottom initial barrier layer, the initial word line layer and the top initial barrier layer may be formed by any suitable deposition process.

Figure 3E:
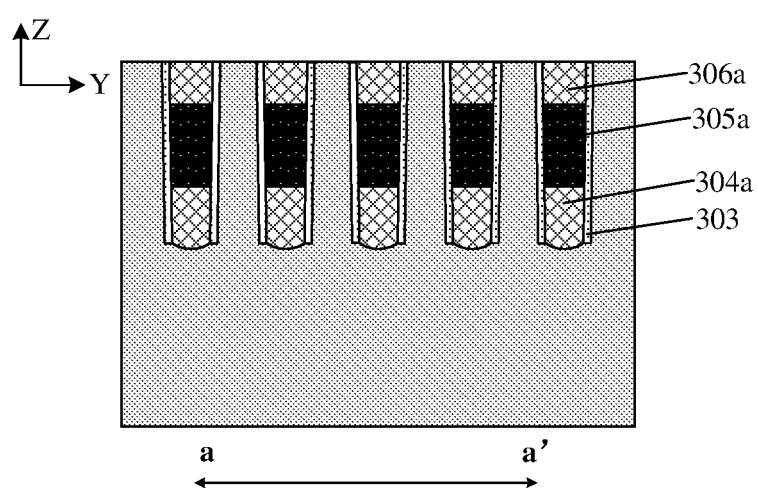
FIG. 3E is a twenty-fifth schematic structural diagram of a forming process of a semiconductor structure provided by the embodiments of the disclosure.

As shown in FIG. 3E, a gate insulating layer 303 is formed on the sidewalls of the word line trench 302, and the bottom initial barrier layer 304a, the initial word line layer 305a and the top initial barrier layer 306a are formed in sequence in the word line trench with the gate insulating layer 303 formed.

In S193, part of the top initial barrier layer, part of the initial word line layer and part of the bottom initial barrier layer are etched in sequence in the third direction to form a word line isolation trench located at the center of the word line trench, and the remaining initial word line layer constitutes the word line. Part of the bottom initial barrier layer is retained at the bottom of the word line isolation trench.

Figure 3F:
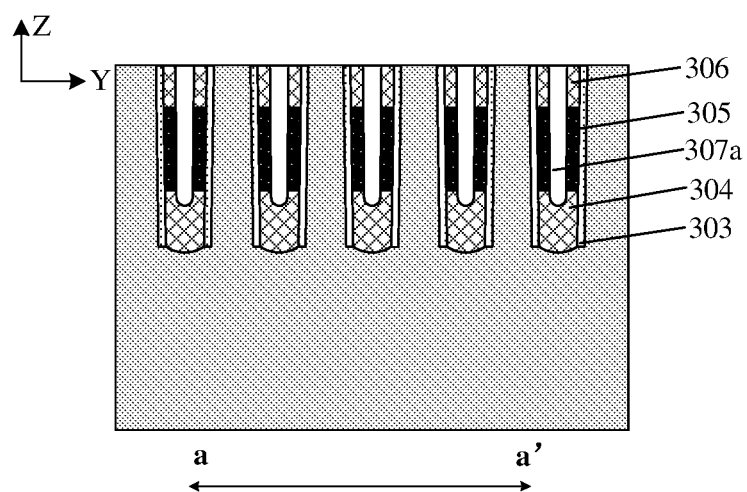
FIG. 3F is a twenty-sixth schematic structural diagram of a forming process of a semiconductor structure provided by the embodiments of the disclosure.

As shown in FIG. 3F, part of the top initial barrier layer 306a, part of the initial word line layer 305a and part of the bottom initial barrier layer 304a are etched in sequence in the Z-axis direction to form the word line isolation trench 307a located at the center of the word line trench. The remaining initial word line layer constitutes the word line 305, the remaining top initial barrier layer constitutes the top barrier layer 306 of the semiconductor structure, and the remaining bottom initial barrier layer constitutes the bottom barrier layer 304 of the semiconductor structure. In the embodiments of the disclosure, a part of the bottom initial barrier layer 304a is also retained at the bottom of the word line isolation trench 307a.

In some embodiments, after the word lines are formed, the method for forming a semiconductor structure further includes the following operation.

In S20, an insulating material is filled in the word line isolation channels to form word line isolation layers.

Figure 3G:
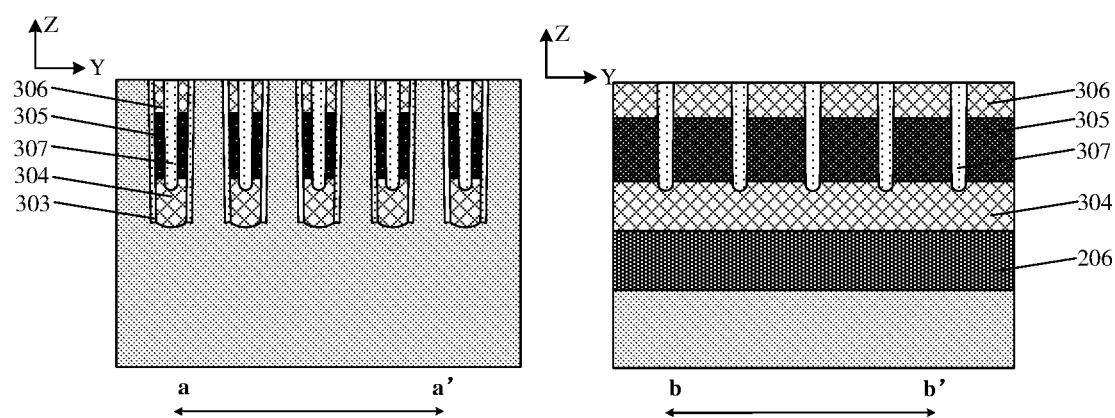
FIG. 3G is a twenty-seventh schematic structural diagram of a forming process of a semiconductor structure provided by the embodiments of the disclosure.
Figure 3H:
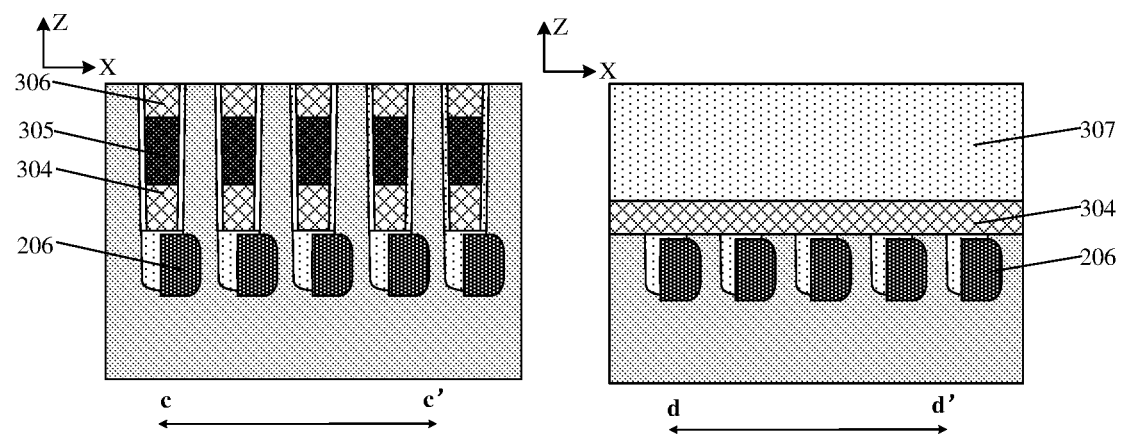
FIG. 3H is a twenty-eighth schematic structural diagram of a forming process of a semiconductor structure provided by the embodiments of the disclosure.

As shown in FIG. 3G and FIG. 3H, an insulating material is deposited in the word line isolation trench 307a by any suitable deposition process to form the word line isolation layer 307. The word line isolation layer is used to isolate adjacent word lines 305.

It is to be noted that the method for forming a semiconductor structure provided by the embodiments of the present disclosure is applicable to any vertical fate-all-around (VGAA) semiconductor device, such as dynamic random access memory (DRAM).

The semiconductor structure formed by the method for forming a semiconductor structure provided by the embodiments of the present disclosure includes buried word line and buried bit line. Part of a bit line is buried in the bit line isolation trench, and another part of the bit line is buried in the bottom of the first semiconductor pillar, so that the bit line resistance, voltage and current of the formed semiconductor structure can be reduced, and the parasitic capacitance between two adjacent bit lines can be reduced, thereby improving the performance of the semiconductor structure.

Figure 4A:
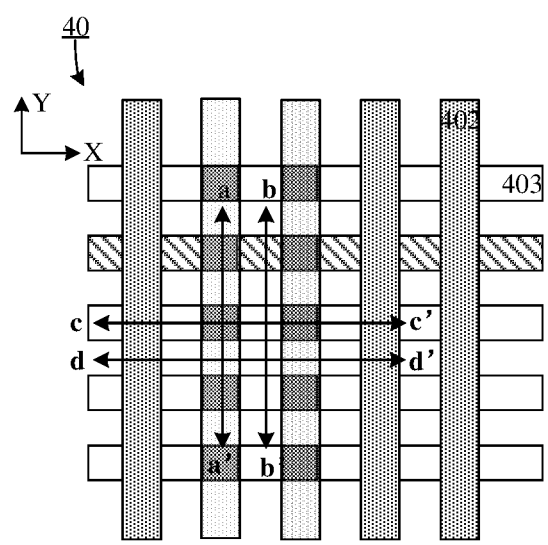
FIG. 4A is an optional top view of a semiconductor structure provided by an embodiment of the disclosure.
Figure 4B:
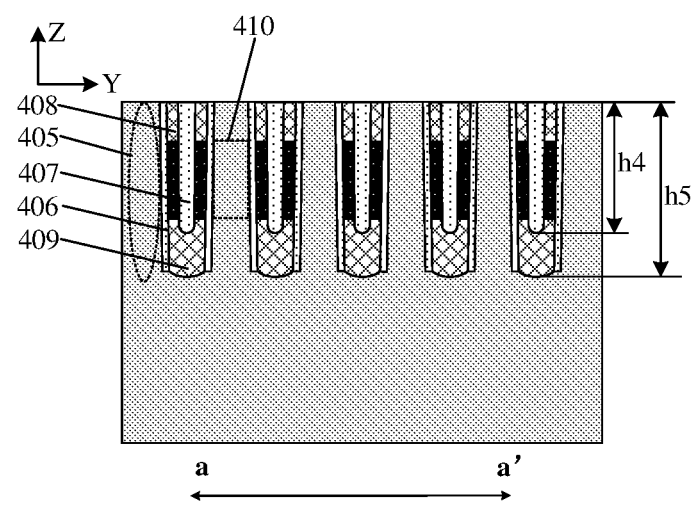
FIG. 4B is a first sectional diagram in a different direction of a semiconductor structure provided by the embodiments of the disclosure.
Figure 4C:
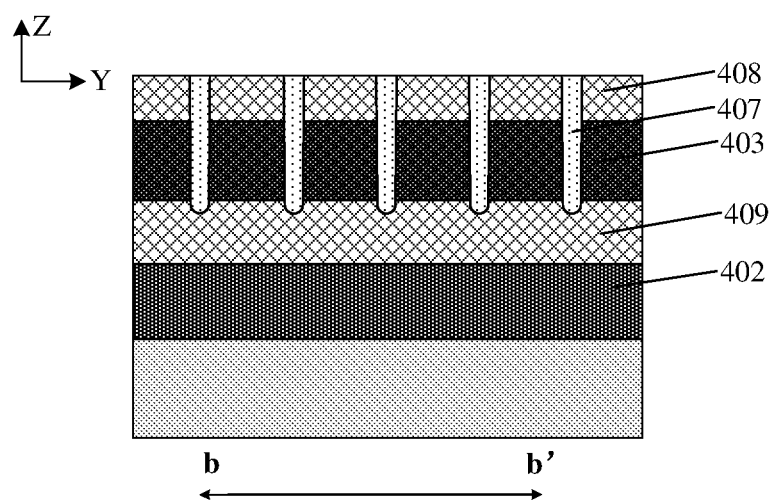
FIG. 4C is a second sectional diagram in a different direction of a semiconductor structure provided by the embodiments of the disclosure.
Figure 4D:
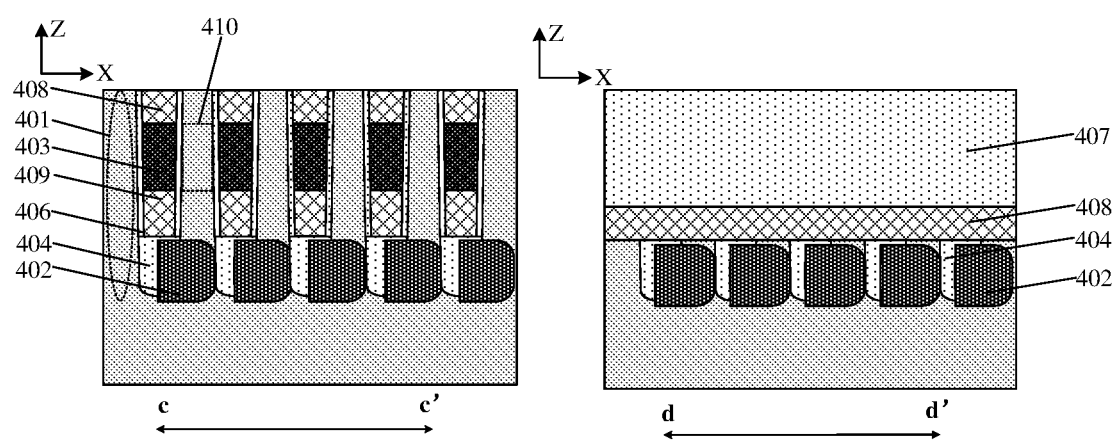
FIG. 4D is a third sectional diagram in a different direction of a semiconductor structure provided by the embodiments of the disclosure.

In addition, the embodiments of the disclosure further provide a semiconductor structure prepared by the method for forming a semiconductor structure provided by the above embodiments. FIG. 4A is an optional top view of a semiconductor structure provided by an embodiment of the disclosure, and FIG. 4B to FIG. 4D are sectional diagrams of the semiconductor structure in different directions, respectively. As shown in FIG. 4A to FIG. 4D, the semiconductor structure 40 includes a semiconductor substrate, bit lines 402, and word lines 403.

The semiconductor substrate includes a plurality of semiconductor pillars 401 (corresponding to the first semiconductor pillars after etched to form the second semiconductor pillars in the above embodiments) and bit line isolation trenches arranged at intervals in a first direction. The bit line isolation trenches are filled with the bit line isolation layers 404. In the embodiment of the disclosure, the bit line isolation trenches extend in a second direction. That is, the bit line isolation layers 404 extend in the second direction, and the first direction is perpendicular to the second direction.

In the embodiments of the present disclosure, the first direction is defined as an X-axis direction, the second direction is defined as a Y-axis direction, and the third direction is defined as a Z-axis direction.

Part of a bit line 402 is buried at the bottom of the semiconductor pillar 401, and another part of the bit line 402 is buried at a bottom corner between the bit line isolation layer 404 and the bit line isolation trench. The bit lines 402 extend in the Y-axis direction.

In some embodiments, the semiconductor substrate further includes a plurality of word line trenches and second semiconductor pillars 405 arranged at intervals in the Y-axis direction. The first semiconductor pillars 401 include the second semiconductor pillars 405. The semiconductor structure 40 further includes: a gate insulating layer 406 located on sidewalls of the word line trenches; a word line isolation layer 407 located at the center of each of the word line trenches. The top surface of the word line isolation layer 407 is flush with the top surface of the second semiconductor pillar 405. The dimension h4 of the word line isolation layer in the third direction is smaller than the dimension h5 of the word line trench in the third direction. The third direction is the depth direction of the word line trench.

In some embodiments, word lines 403 are located between the gate insulating layer 406 in the middle of the word line trench and the corresponding word line isolation layer 407. The semiconductor structure 40 further includes a top barrier layer 408 and a bottom barrier layer 409. The top barrier layer 408 is located between the gate insulating layer 406 at the top of the word line trench and the corresponding word line isolation layer 407. The bottom barrier layer 409 is located at the bottom of the word line corresponding with the gate insulating layer 406 formed, and is in contact with the word lines 403 and part of the word line isolation layer 407.

In some embodiments, the semiconductor structure further includes a channel 410. The channel 410 is located between two adjacent gate insulating layers 406, and the channel 401 is the second semiconductor pillar region corresponding to the word lines 402 and between two adjacent gate insulating layers 406.

In other embodiments, the semiconductor structure may further include a functional device such as a storage capacitor or an adjustable resistor which are not described in detail herein.

The semiconductor structure in the embodiments of the disclosure is similar to the method for forming a semiconductor structure in the above-mentioned embodiments. The technical features not disclosed in detail in the embodiments of the disclosure can be understood with reference to the above-mentioned embodiments, and thus will not be repeated here.

In the semiconductor structure formed by the method for forming a semiconductor structure provided by the embodiments of the present disclosure, part of a bit line is buried in the bit line isolation trench, and another part of the bit line is buried in the bottom of the first semiconductor pillar. Thus, the bit line resistance, voltage and current of the formed semiconductor structure can be reduced, and the parasitic capacitance between two adjacent bit lines can be reduced, thereby improving the performance of the semiconductor structure.

In several embodiments provided by the present disclosure, it should be understood that the disclosed device and method may be implemented in a non-targeted manner. The device embodiments described above are only illustrative. For example, the division of units is only a logical function division, and can be done in other ways in practice implementation. For example, multiple units or components can be combined, or integrated into another system, or some features can be ignored or not implemented. In addition, the components shown or discussed are coupled or directly coupled with each other.

The units described above as separate components may or may not be physically separated, the components shown as a unit may or may not be a physical unit, i.e. it may be located in one place or may be distributed over multiple network units. Part or all of the units can be selected according to actual requirements to achieve the purpose of the embodiment solution.

The features disclosed in several method or device embodiments provided in the disclosure can be arbitrarily combined as long as there is no conflict therebetween to obtain a new method or device embodiment.

The descriptions above are only some implementations of the embodiments of the present disclosure, and are not intended to limit the protection scope of the embodiments of the present disclosure. Any change and replacement that is easily to be conceived of within the protection scope of the embodiments of the disclosure by those skilled in the art falls within the protection scope of the present disclosure. Therefore, the protection scope of the embodiments of the disclosure shall be subject to the claims.

Embodiments of the present disclosure provide a semiconductor structure and a method for forming the same. The method for forming a semiconductor structure includes: providing a semiconductor substrate including a plurality of first semiconductor pillars and bit line isolation trenches arranged at intervals in a first direction; the bit line isolation trenches extending in a second direction; forming a bit line isolation layer in the bit line isolation trenches, in which a gap is provided between the bit line isolation layer and the bit line isolation trench, the gap being located at the bottom corner of the bit line isolation trench and extending in the second direction; etching the first semiconductor pillars in the first direction through the gaps to form bit line trenches; forming bit lines in the bit line trenches. In the semiconductor structure formed by the method for forming a semiconductor structure provided by the embodiments of the present disclosure, part of a bit line is buried in the bit line isolation trench, and another part of the bit line is buried in the bottom of the first semiconductor pillar. Thus, the bit line resistance, voltage and current of the formed semiconductor structure can be reduced, and the parasitic capacitance between two adjacent bit lines can be reduced, thereby improving the performance of the semiconductor structure.

What is claimed is:

1. A method for forming a semiconductor device, comprising:
   providing a semiconductor substrate comprising a plurality of first semiconductor pillars and bit line isolation trenches arranged at intervals in a first direction; wherein the bit line isolation trenches extend in a second direction, and the first direction is perpendicular to the second direction;
   forming a bit line isolation layer in at least one of the bit line isolation trenches; wherein a gap is provided between the bit line isolation layer and the at least one of the bit line isolation trenches, wherein the gap is located at a bottom corner of the at least one of the bit line isolation trenches and extends in the second direction, and the gap exposes part of a bottom of the at least one of the bit line isolation trenches;
   etching at least one of the first semiconductor pillars in the first direction through the gap to form the one of the at least a bit line trenches; and
   forming a bit line in the at least one of the bit line trenches;
   wherein forming the bit line isolation layer in at least one of the bit line isolation trenches comprises:
   forming an initial bit line isolation layer in at least one of the bit line isolation trenches; and
   removing part of the initial bit line isolation layer to form the bit line isolation layer and the gap;
   wherein forming the initial bit line isolation layer in at least one of the bit line isolation trenches comprises:
   forming a first initial isolation layer and a second initial isolation layer in sequence in at least one of the bit line isolation trenches;
   removing part of the second initial isolation layer and part of the first initial isolation layer in sequence by etching in a third direction to form a first etching groove; wherein the first etching groove exposes a first sidewall of at least one of the bit line isolation trenches and another part of the bottom of at least one of the bit line isolation trenches; and the third direction is a depth direction of at least one of the bit line isolation trenches; and
   filling an isolation material in the first etching groove to form a third initial isolation layer,
   wherein remaining first initial isolation layer, remaining second initial isolation layer and the third initial isolation layer constitute the initial bit line isolation layer.

2. The method of claim 1, wherein
   removing the part of the initial bit line isolation layer to form the bit line isolation layer and the gap comprises:
   etching the remaining second initial isolation layer and the remaining first initial isolation layer in sequence in the third direction at an end of the bit line isolation trench to form at least one opening; and
   removing a further remaining first initial isolation layer of the initial bit line isolation layer through the opening to form the bit line isolation layer and the gap.

3. The method of claim 2, wherein
   etching the first semiconductor pillar in the first direction through the gap to form the bit line trench comprises:
   partially etching the first semiconductor pillar in the first direction through the gap to form a second etching groove; wherein a dimension of the second etching groove in the third direction is equal to a dimension of the gap in the third direction, and a dimension of the second etching groove in the first direction is smaller than a dimension of the first semiconductor pillar in the first direction;
   the second etching groove and the gap jointly constitute the bit line trench.

4. The method of claim 2, wherein
   etching the first semiconductor pillar in the first direction through the gap to form the bit line trench comprises:
   fully etching the first semiconductor pillar in the first direction through the gap to form a third etching groove; wherein a dimension of the third etching groove in the third direction is equal to a dimension of the gap in the third direction, and a dimension of the third etching groove in the first direction is equal to a dimension of the first semiconductor pillar in the first direction;

the third etching groove and the gap jointly constitute the bit line trench.

5. The method of claim 3, further comprising:

before forming the bit line, etching a further remaining second initial isolation layer in the third direction to form a fourth etching groove; wherein the fourth etching groove expose the gap and a second sidewall of the bit line isolation trench; and forming the bit line in the bit line trench through the fourth etching groove.

6. The method of claim 5, wherein forming the bit line in the bit line trench through the fourth etching groove comprises:

forming an initial bit line layer in the fourth etching groove and the bit line trench; and etching back the initial bit line layer to remove the initial bit line layer located in the fourth etching groove to form the bit line.

7. The method of claim 6, further comprising:

after forming the bit line, filling an insulating material in the fourth etching groove to form an insulating layer;

wherein a top surface of the insulating layer is flush with a top surface of the third initial isolation layer.

8. The method of claim 7, further comprising:

after forming the insulating layer, forming a plurality of word line trenches in the first semiconductor pillars, wherein the word line trenches extend in the first direction; and forming word lines in the word line trenches.

9. The method of claim 8, wherein forming the plurality of word line trenches in the first semiconductor pillars comprises:

etching the first semiconductor pillars in the third direction to form a plurality of word line trenches and second semiconductor pillars arranged at intervals in the second direction;

wherein a bottom of a word line trench is above a top of the bit line.

10. The method of claim 9, wherein forming the word lines in the word line trenches comprises:

forming gate insulating layers on sidewalls of a word line trench;

forming a bottom initial barrier layer, an initial word line layer and a top initial barrier layer in sequence in the word line trench with the gate insulating layers formed; and etching part of the top initial barrier layer, part of the initial word line layer and part of the bottom initial barrier layer in sequence in the third direction to form a word line isolation trench located at a center of the word line trench, remaining initial word line layer constituting a word line;

wherein a part of the bottom initial barrier layer is remained at a bottom of the word line isolation trench.

11. The method of claim 10, further comprising: after forming the word lines, filling an insulating material in the word line isolation trench to form a word line isolation layer.

* * * * *